United States Patent [19]
Ohtsu et al.

[11] Patent Number: 5,456,632
[45] Date of Patent: Oct. 10, 1995

[54] COOLING DEVICE AND COOLING SYSTEM FOR AN INFORMATION RECORDING AND PLAY-BACK DEVICE OF AN EXTERNAL MEMORY APPARATUS

[75] Inventors: Ikuroh Ohtsu, Hadano; Toshiya Tsukasa, Hatano; Junichi Watanabe, Yokohama, all of Japan

[73] Assignee: Ricoh Company, Ltd., Tokyo, Japan

[21] Appl. No.: 136,195

[22] Filed: Oct. 15, 1993

[30] Foreign Application Priority Data

Oct. 15, 1992 [JP] Japan ................................. 4-277317

[51] Int. Cl.⁶ ........................................................ H05K 7/20
[52] U.S. Cl. ............................ 454/184; 361/695; 493/397
[58] Field of Search .................................. 361/695, 697; 454/184, 346; 493/395, 397

[56] References Cited

U.S. PATENT DOCUMENTS

| | | | |
|---|---|---|---|
| 1,948,755 | 2/1934 | Gullicksen | 454/346 X |
| 2,734,441 | 2/1956 | Williams | 454/184 |
| 3,962,608 | 6/1976 | Forster et al. | 361/695 |
| 4,530,685 | 7/1985 | Freeman | 493/397 X |
| 4,702,154 | 10/1987 | Dodson | 454/184 |
| 5,171,183 | 12/1992 | Pollard et al. | 454/184 |
| 5,251,096 | 10/1993 | Hosoi et al. | 361/695 |
| 5,287,009 | 2/1994 | Heung | 361/695 X |
| 5,297,005 | 3/1994 | Gourdine | 361/695 X |

*Primary Examiner*—Harold Joyce
*Attorney, Agent, or Firm*—Oblon, Spivak, McClelland, Maier & Neustadt

[57] ABSTRACT

An external memory apparatus for an information recording and play-back device, with the external memory apparatus having an improved cooling arrangement. In particular, a cooling fan is disposed inside of the housing, at a location spaced from a wall of the housing, with an exhaust outlet provided having a smaller area than that of the cooling fan. The exhaust outlet is preferably connected to the cooling fan by a duct, with the cooling system allowing the overall size of the external memory apparatus to be minimized.

18 Claims, 9 Drawing Sheets

COOLING DEVICE AND COOLING SYSTEM FOR AN INFORMATION RECORDING AND PLAY-BACK DEVICE OF AN EXTERNAL MEMORY APPARATUS

BACKGROUND OF THE INVENTION

1. Field of the Invention

The present invention relates to an improved cooling device or cooling system for an information recording and play-back device of an external memory apparatus, for example an optical disk drive device, an optical magnetic disk drive device, etc., each of which is driven when information is recorded on the external memory and when information is played back therefrom.

2. Discussion of Background

Figure 13:
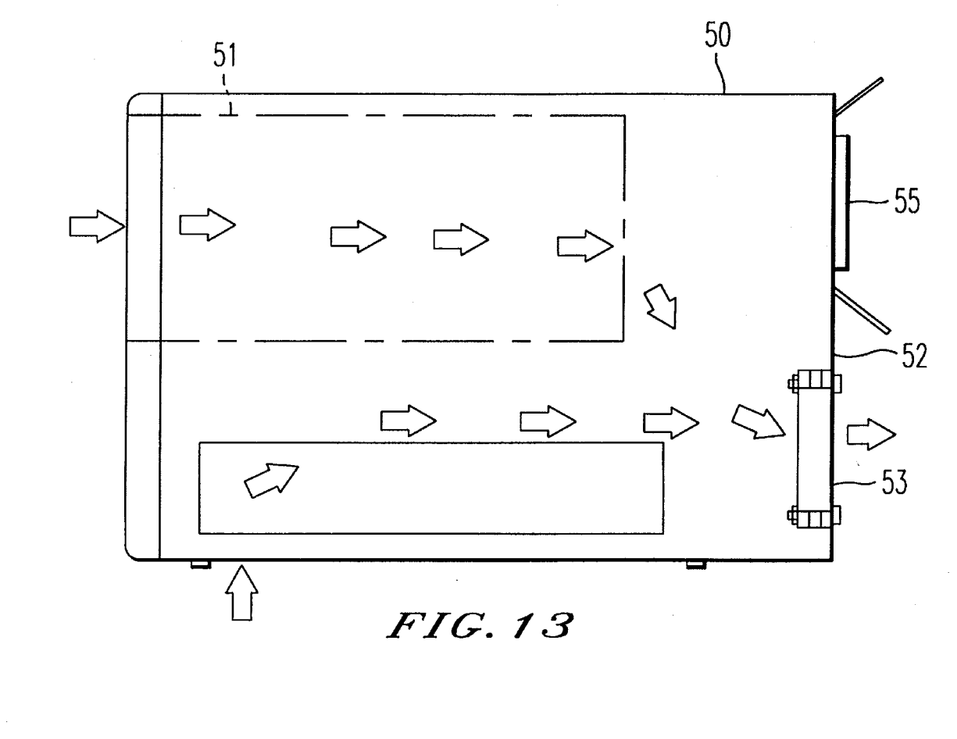
FIG. 13 is a schematic cross-sectional view of an external memory apparatus of the prior art.
Figure 14:
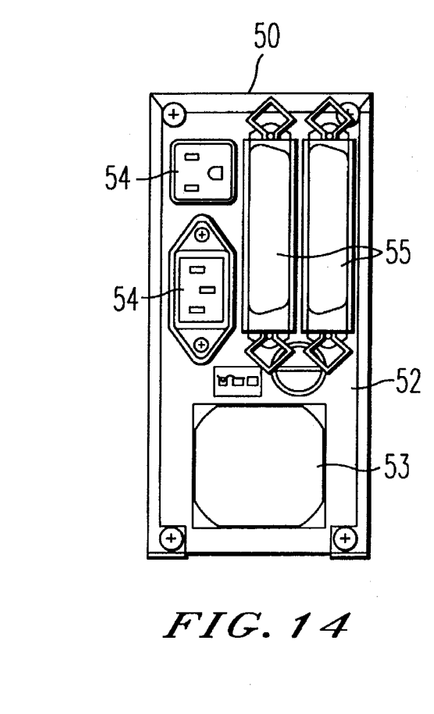
FIG. 14 is a rear side view of the external memory apparatus of the prior art.

In a conventional external memory apparatus, as shown in FIGS. 13 and 14, a cooling fan 53 is fixed to a rear side panel 52 of the external memory apparatus to cool the disk drive device (e.g., an information recording and playback device) which is installed in a housing case 50. This cooling fan 53 discharges air from the housing 50 and draws in air from outside the housing such that air passes therethrough and thereby cools the disk drive device. The disk drive device 51, e.g. an optical disk drive or an optical magnetic disk drive, is preferably formed to be compact. However, the conventional apparatus requires an outlet or opening in the rear panel 52 of the housing of the same size as the cooling fan 53 so that the cooling fan 53 can be set in the outlet. Furthermore, a power-input connector 54, an interface connector 55 and additional functioning switches should be connected to or provided on the rear panel 5. This means that, despite efforts to make the drive device 51 compact, the overall disk drive apparatus cannot be as compact as desired.

SUMMARY OF THE INVENTION

The present invention has been realized as a solution to the above problems.

Accordingly, it is an object of the present invention to provide an external memory device which is compact.

It is a further object of the present invention to provide a cooling system for an external memory device which has minimal space requirements, particularly with respect to external surface areas of the housing of the memory device.

These and other objects and advantages are achieved by the present invention in an external memory apparatus having an improved cooling device or cooling system for an information recording and play-back device. The objective in providing a compact external memory apparatus is realized by disposing a cooling fan inside of the housing of the external memory apparatus, and providing an exhaust outlet for air flow which is smaller in size or area than the cooling fan, with the exhaust outlet disposed in the housing wall. Although conventional arrangements have apparently sought to achieve compactness by placing the cooling fan immediately adjacent to a housing wall, in accordance with the present invention, it has been recognized that a greater compactness can be achieved by spacing a cooling fan from a wall of the housing such that less total housing area is required, while the housing is able to accommodate the necessary interface or coupling fixtures more efficiently.

BRIEF DESCRIPTION OF THE DRAWING

A more complete appreciation of the invention and many of the attendant advantages thereof will become readily apparent from the following detailed description, particularly when considered in conjunction with the accompanying drawings, in which.

DETAILED DESCRIPTION OF THE PREFERRED EMBODIMENTS

Figure 1:
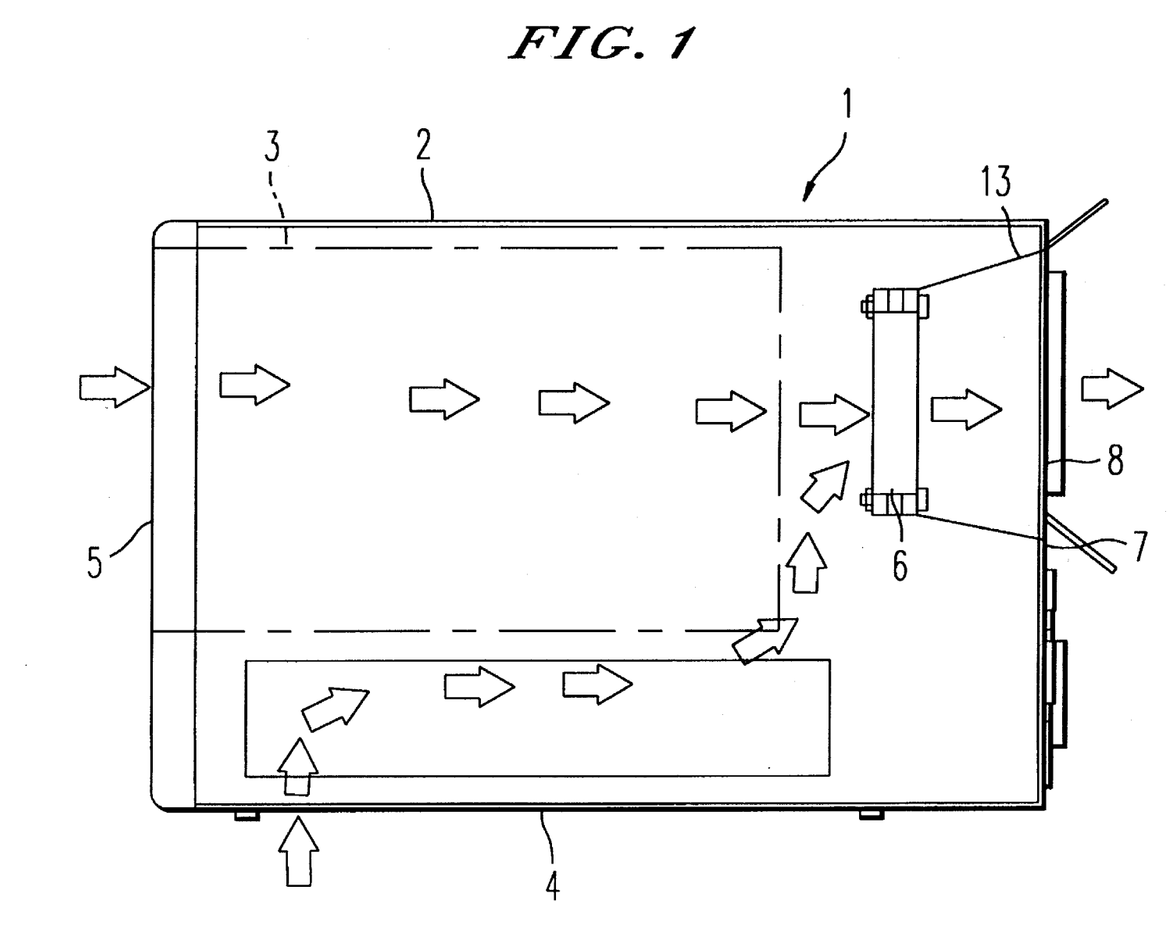
FIG. 1 is a cross-sectional view of the external memory apparatus including a cooling system of the present invention.

Referring now to the drawings, wherein like reference numerals designate identical or corresponding parts throughout the several view, FIG. 1 is a cross-sectional view of the external memory apparatus employing the present invention. As shown in FIG. 1, a drive device 3, such as an information recording and play back device (hereinafter referred to as drive device 3) and power supply device 4, both of which require cooling, are installed inside a housing 2 of an external memory apparatus 1. In the housing, a cooling fan device 6, which cools both the drive device 3 and power supply device 4, is installed, the size of which is the same as a conventional fan device as shown in FIGS. 13 and 14.

Figure 2:
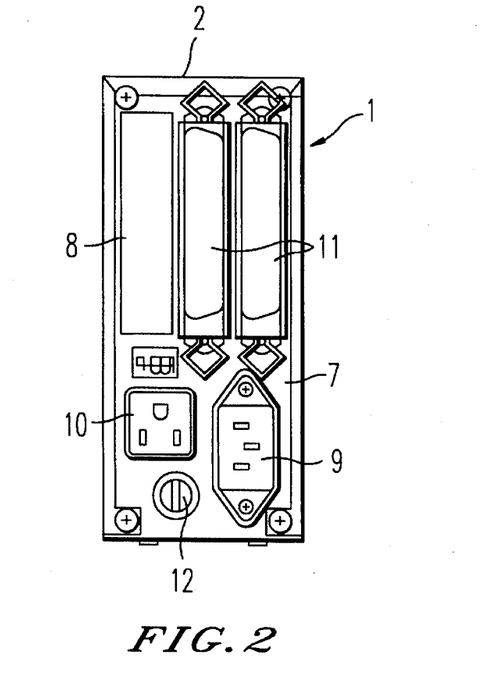
FIG. 2 is a rear view of the housing and associated coupling fixtures of the external memory apparatus.

In a rear panel 7 of the housing 2 an exhaust outlet 8 is provided which exhausts air which has been drawn in by the cooling fan 6 to the outside of the housing 2, with the exhaust outlet formed as shown in FIG. 2. Further, an electric power input connector 9, an electric power output connector 10, an interface connector 11 and fuse member 12 are also disposed in the rear panel 7.

In the external memory apparatus 1 as discussed above, the cooling fan 6, the size of which can be the same as a conventional one, is disposed not on the rear panel 7, but rather is disposed inside of the external memory apparatus 1, and the air exhaust outlet 8 is disposed on the rear panel 7 of the external memory apparatus 1, such that the air exhaust outlet 8 can be disposed at a vacant place or location on the rear panel 7. Therefore, the flexibility in positioning the connectors 9, 10, etc. on the rear panel 7 is improved. Thus, even if the size of the air exhaust outlet 8 is the same as that of the cooling fan, by disposing the cooling fan inside of the apparatus, the size of the external memory apparatus 1 can be minimized by the enhanced flexibility in disposing the connectors on the panel 7. In other words, in accordance with the present invention, it has been recognized that by disposing the fan spaced from the wall of the housing, the fan does not interfere with the space requirement of the connectors, outlets or other fixtures (which typically protrude somewhat into the housing and include wires extending therefrom), such that a more compact arrangement is achieved even where the size of the outlet is the same as that of the conventional arrangement. Furthermore, in accordance with the present invention, the air exhaust outlet 8 can have an area smaller than the area of the cooling fan 6, such that even further compactness is realized for the external memory apparatus 1.

If an air exhaust outlet is provided on the rear panel 7 of the housing 2 of the same size as the cooling fan 6, a neighboring part of the air exhaust outlet may lack sufficient strength against external forces, so that a compensating structure of the rear panel 7 is additionally required. However, the present invention can avoid such problems by employing an exhaust outlet 8 having an area on the rear panel 7 of the housing 2 which is smaller than that of the cooling fan. Further, the arrangement of the duct which connects the outlet and the fan can be such that in areas adjacent to the rear wall of the housing, the duct does not interfere with the various fixtures disposed on the rear wall of the housing.

If an exhaust outlet 8 were provided for exhausting air alone, the cooling could become difficult as a result of the smaller area of the exhaust outlet as compared with the area of the cooling fan. However, in accordance with the present invention, by providing a duct 13 disposed between the cooling fan 6 and the air exhaust outlet 8, effective exhaust is accomplished despite the exhaust outlet 8 having an area smaller than that of the cooling fan 6 as will become further apparent hereinafter. In particular, when the cooling fan 6 is activated by the motor (not shown in the Figures), the air outside the housing is drawn in through or past a disk setting and detecting part 5 (FIG. 1) or the like, which is disposed at the front side panel of the housing 2. The air passes through the disk drive device 3, and then is exhausted through the air exhaust outlet 8, with the assistance of the duct 13, to the outside of the housing 1 as shown in FIG. 1. As a result, the air inside the housing can be efficiently exhausted to the outside. Further, as shown in FIG. 1, in this embodiment, the air flow enters not only from the front side, but also from another side of the housing 1, such that the electric power supply device can be cooled.

Figure 3:
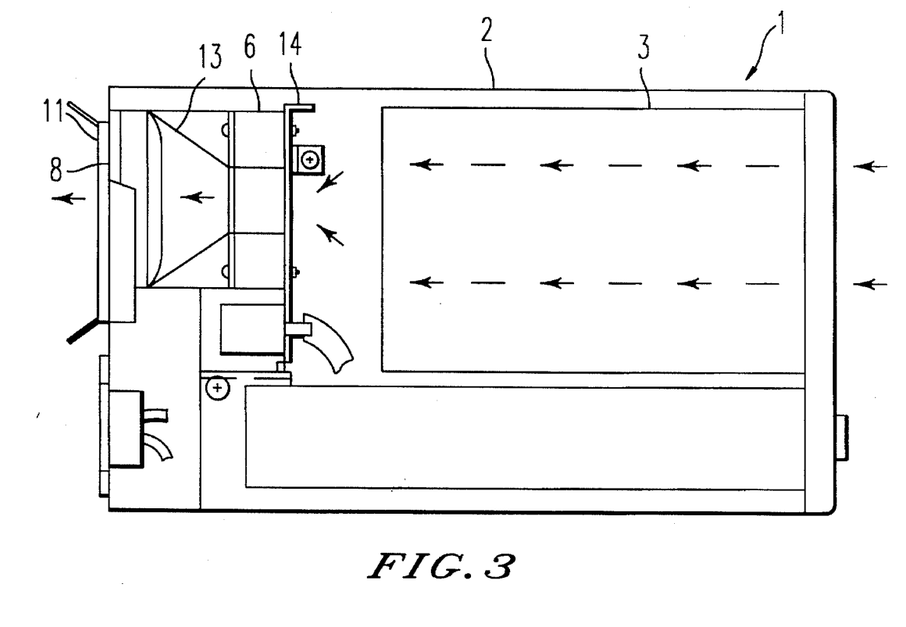
FIG. 3 is a cross-sectional view of a modified form of the external memory apparatus employing the present invention.
Figure 4:
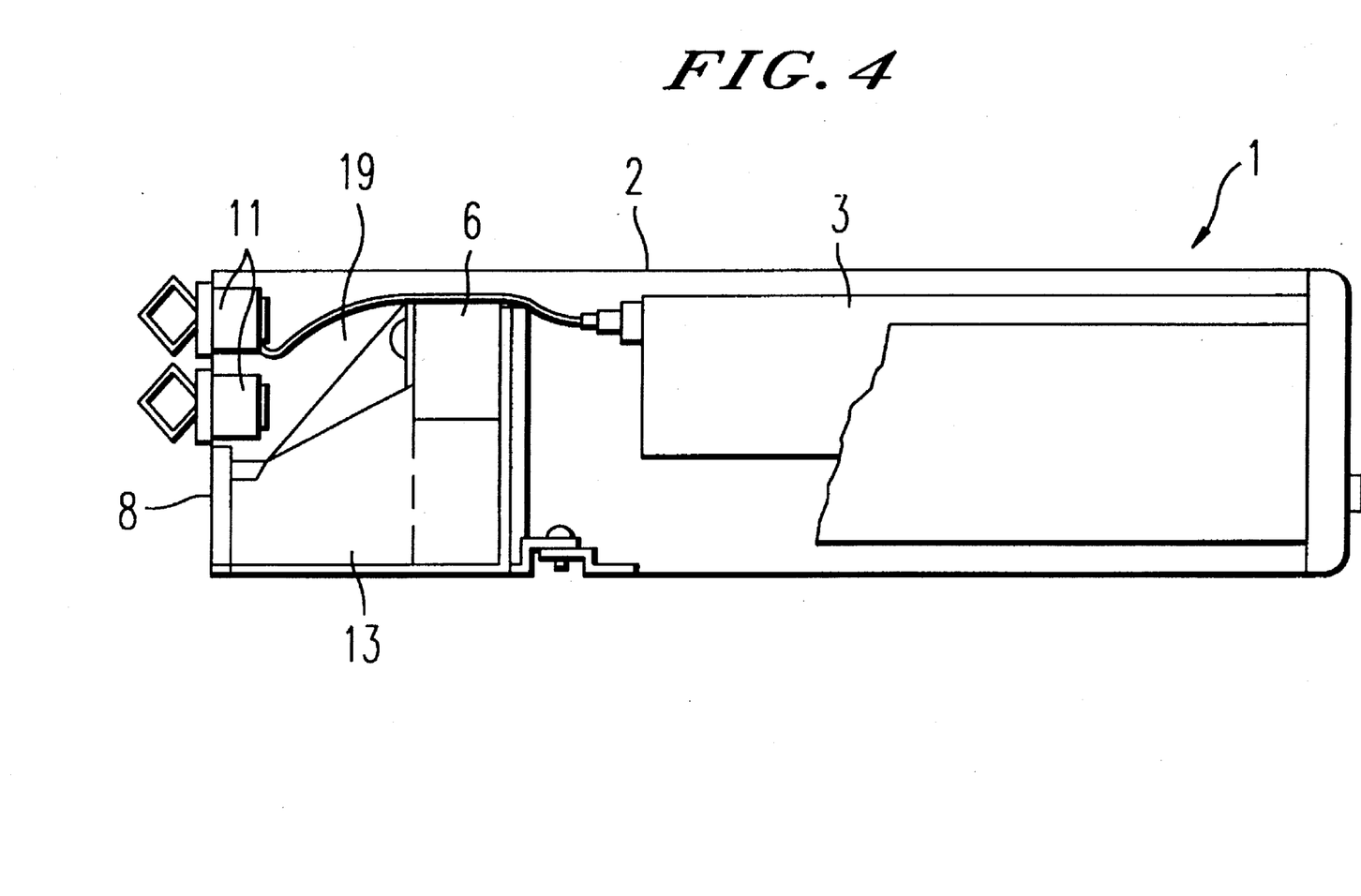
FIG. 4 is a bottom plan and partially cut-away view of the external memory apparatus of FIG. 3 employing the present invention.

Another embodiment or aspect of the present invention is shown in FIGS. 3 and 4. In FIGS. 3 and 4, a cooling fan 6 is fixed to the support frame 14 by a screw 15 (FIG. 6), and the supporting frame 14 is fixed to the housing 2 by a screw. The duct 13 is made of a sheet material 16 having a predetermined shape formed by folding the sheet material.

Figure 5:
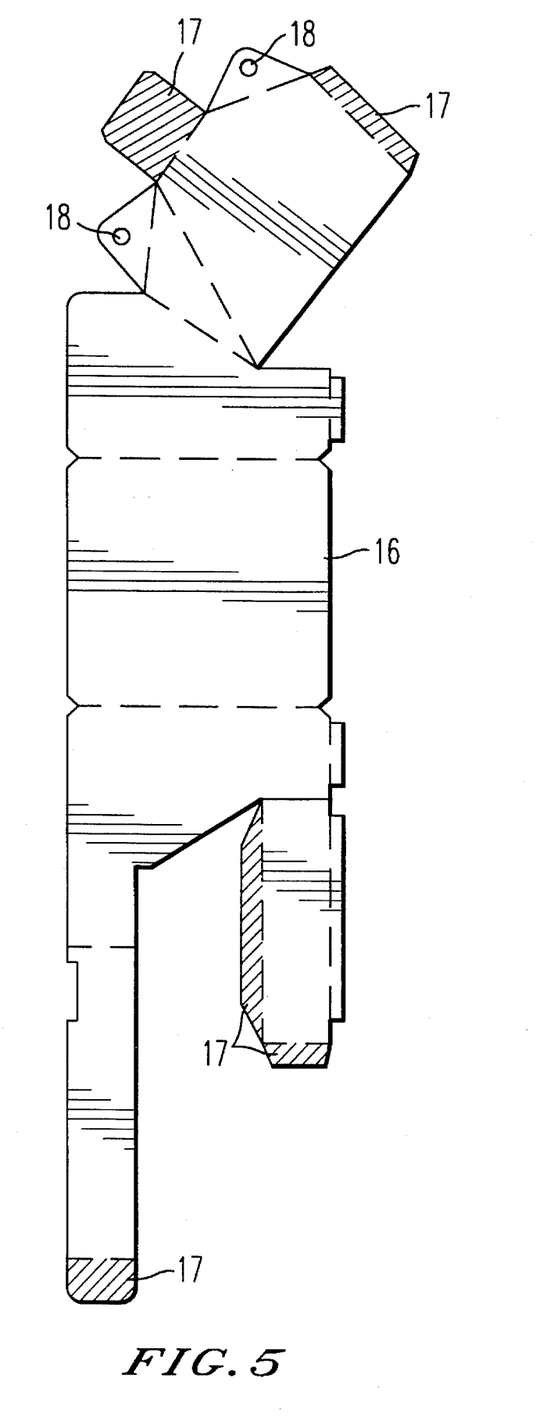
FIG. 5 is a plan view of a blank of sheet material which can be utilized for forming the duct for the cooling device.
Figure 6:
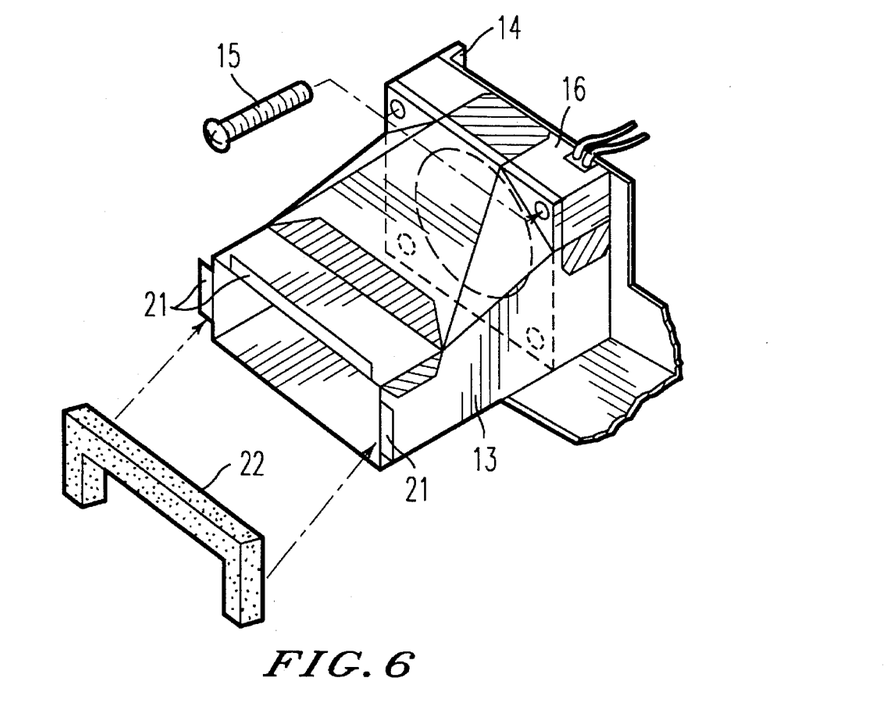
FIG. 6 is a perspective and partially cut-away view of the external memory apparatus showing the assembly and mounting of the duct device.
Figure 7:
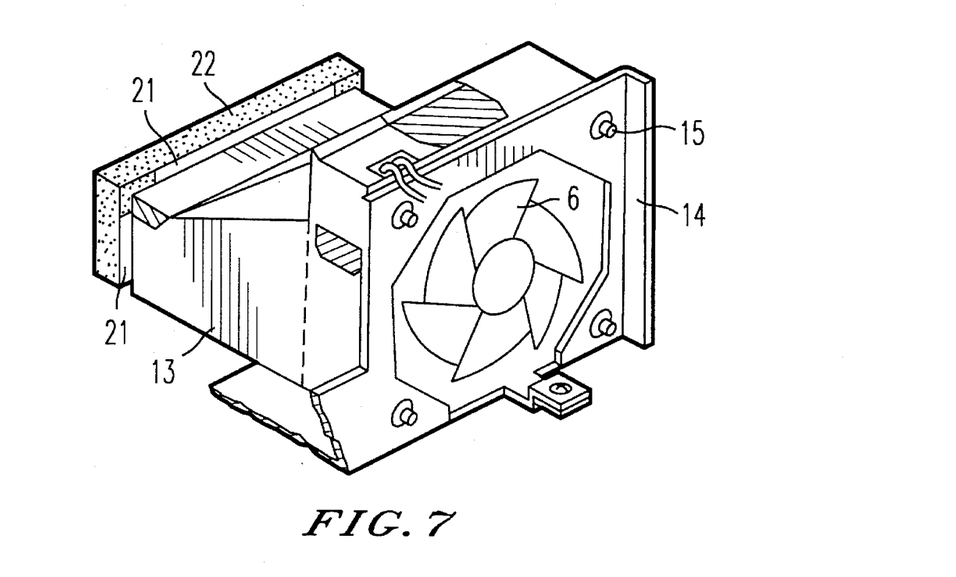
FIG. 7 is a perspective and partially cut-away view of a reverse side of the external memory apparatus of FIG. 6.

The form of the sheet material 16 for the duct is as shown in FIG. 5 prior to folding or bending. As shown in FIG. 5, an overlapping width portion 17, shown by the hatched portions in the figure, are provided which overlap with other parts of the sheet material 16 in the finished form such that the sheet material 16 is connected together (upon itself) with the help of a connecting device. A hole 18 for a screw (not shown in the figure) is provided to screw the duct 13 onto the cooling fan 6, so that, if the sheet material 16 is folded according to the broken line, the duct 13 is formed as shown in FIGS. 6 and 7. Thus, once the duct 13 has been folded and screwed onto the cooling fan 6, a slope 19 of the duct is provided as shown in FIG. 4, so that this part of the duct 13 does not interfere with the interfacing connector 11, or other connectors or fixtures which can be disposed along the wall of the housing. Thus, the duct not only ensures a satisfactory air flow to the exhaust, but also allows the exhaust outlet to be smaller than the area of the fan, with the duct additionally ensuring that room or space is provided inside of the housing at locations adjacent to the exhaust exit or exhaust outlet.

The sheet material 16 can be formed by a steel plate pressing method utilizing a mold. However, it is preferable to utilize a soft type film (for example a metal or a polyester film) etc. having a thickness of less than 0.1 cm. The sheet material 16 made of a metal or other suitable material having a 0.1 mm thickness can be bent by hand utilizing a jig for folding along fold lines provided on the sheet material 16. Therefore, a wide variety of folds can be imparted to the sheet material, and accordingly a complex form of the duct can be obtained, which complex forms can not be achieved by the steel plate pressing method. Alternatively, the sheet material 16 made of a soft type film can also be easily bent (particularly with a soft material) and formed into a predetermined form utilizing a special mold or another pressing operation other than the steel plate pressing mold method.

Thus, the duct 13 is formed by folding the sheet material 16 along the broken line, and connecting the overlapping width (shown by the grid lines or hatched lines) as shown in FIG. 5. If the sheet material 16 is made either of a soft type polyester or metal plate having a thickness of 0.1 mm, and each overlapping width thereof is connected by a welding or heat-melting operation, leakage or air in the duct 13 is prevented, and thus efficient cooling is achieved. Further, the overlapping width is not broken when the duct is set or mounted into the apparatus.

Figure 8:
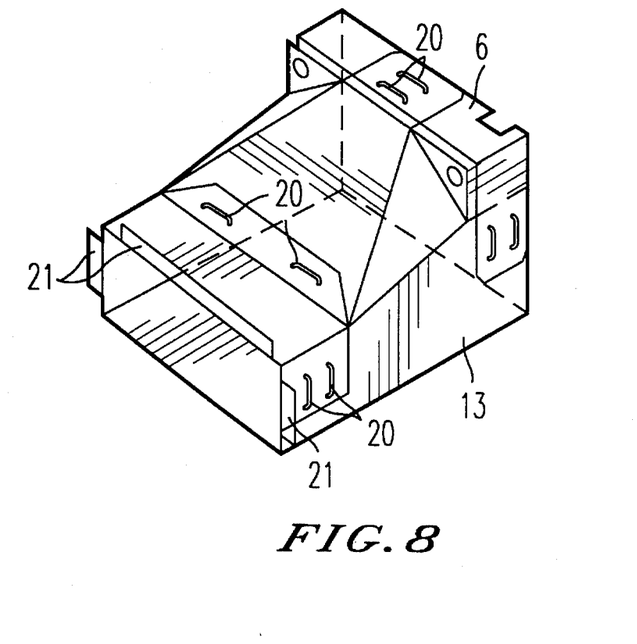
FIG. 8 is a perspective view of another arrangement for fixing or assembling the duct device.

The duct 13 can also be formed by stapling, with staples shown at 20 in the overlapping width 17, with the overlapping width provided slightly larger than in the aforementioned embodiment. The stapled arrangement is shown in FIG. 8. This connecting method is convenient and low-cost, due to the wide spread availability of such stapling tools.

The duct 13, formed by folding the sheet material 16 and connecting the overlapping width portions, is fixed between the cooling fan 6 and the air exhaust outlet 8 as will now be described. A side part of the duct 13 which faces the cooling fan 6 is connected together with the cooling fan 6 to the support frame 14 by a screw 15. Thus, the upper part of the duct is firmly fixed to the frame 14, and the lower part thereof is also supported by sandwiching the lower part between the frame 14 and the cooling fan 6. As a result, a separate support device for the duct is not required, since the screw 15 fixing the cooling fan 6 to the frame 14 also fixes the duct 13 to the frame 14.

Figure 9:
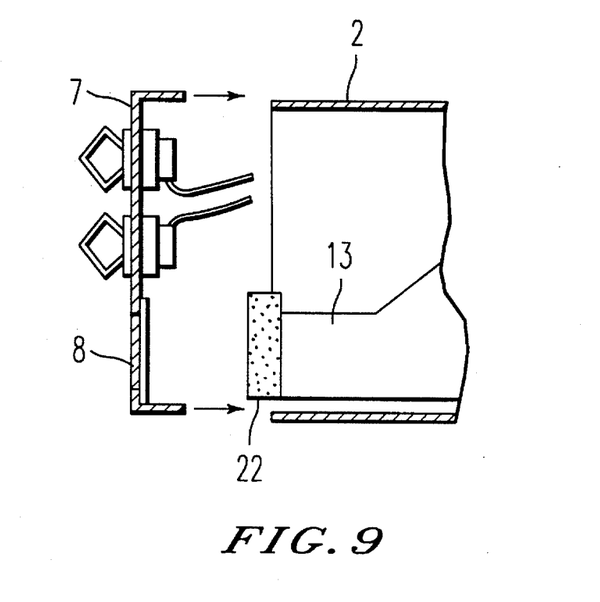
FIG. 9 is a partial cross-sectional view of the external memory apparatus showing an arrangement for a rear panel of the housing.

As shown in FIGS. 6 and 8, a bent portion is provided at the side part of the duct 13 which faces the air exhaust outlet 8 (e.g., with flanges 21 on the downstream side of the duct). Further, an elastic material 22, for example, a soft type elastic material, or a polyurethane foam or sponge-like material is fixed or associated with the bent portions. As shown in FIG. 9, when the rear panel 7 is mounted onto the housing 2, the duct 13 can thus be supported by the housing 2 without requiring a screw or other fastener, by pressing the rear panel 7 against the duct 13 via the elastic material 22. The elastic material 22 effectively functions to avoid vibrations caused by the cooling air or by operation of the various components of the apparatus. Thus, the elastic material suppresses vibration noises and prevents leakage of air.

Figure 10:
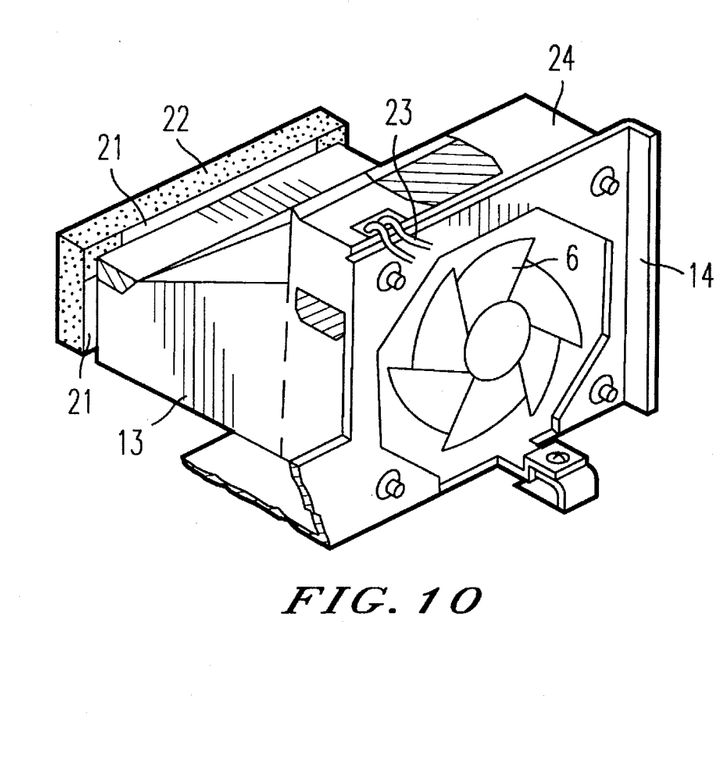
FIG. 10 is a perspective and partially cut-away view of a further embodiment of the present invention.
Figure 11:
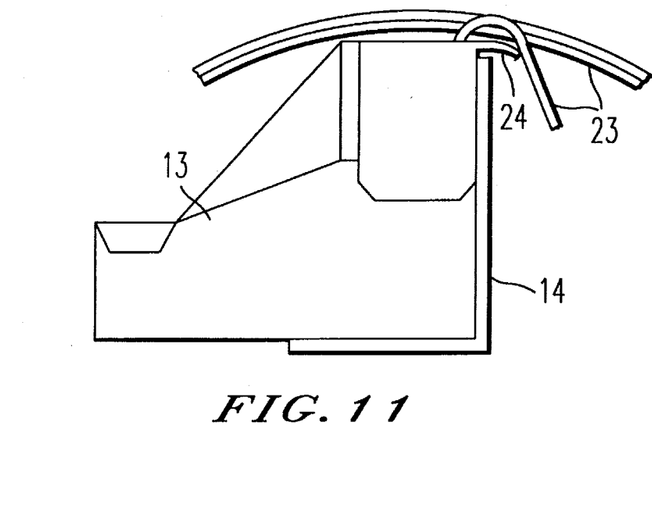
FIG. 11 is a side view of the external memory apparatus as shown in FIG. 10.

Thus, the overall size of the external memory apparatus 1 can be made compact by disposing the cooling fan 6 inside of the housing 2. However, a cable 23 of the cooling fan or the interface connector 11 may be disposed to pass above the cooling fan 6. As a result, there is a possibility that the cable 23 could become damaged by the metal edge of the frame 14 if the cable contacts the metal edge thereof. This problem is avoided in the arrangement shown in FIGS. 10 and 11, in which eaves or overhanging portions 24 are disposed on the upper part of the duct 13, which is preferably formed of a soft-type material, to cover the metal edge of the cooling fan 6 or the mounting frame 14, thereby reducing the possibility of damage to the cable.

Figure 12:
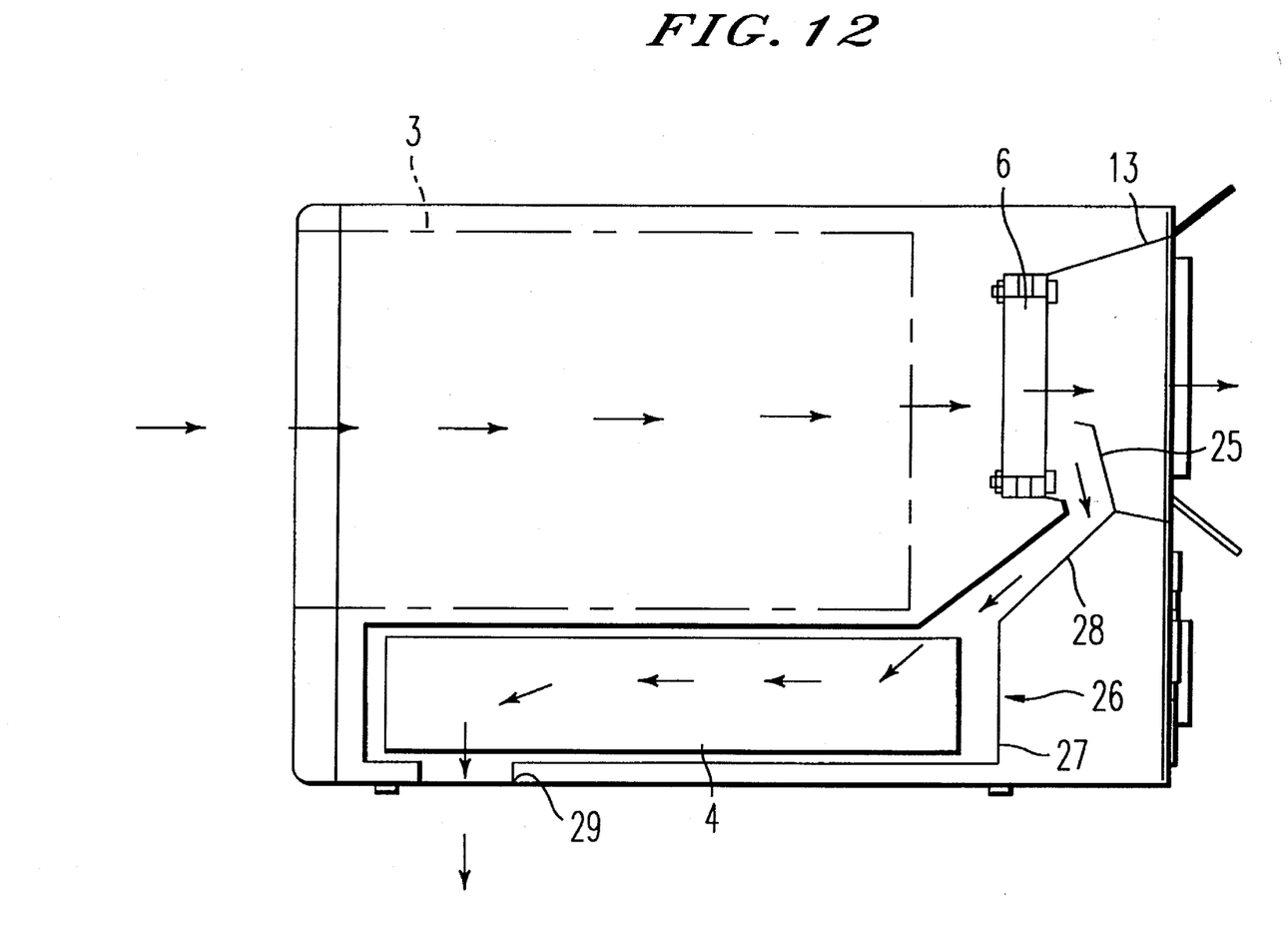
FIG. 12 is a schematic cross-sectional view of a further embodiment of the present invention.

A further embodiment of the invention is shown in FIG. 12. As shown in FIG. 12, a partition 25 can be disposed at a location downstream from the cooling fan 6 to divert a portion of the air. An air guide member 26 is further provided to receive the air diverted by the partition 25 and to cool the electric power source 4 disposed spaced from the disk drive device 3. The guide member 26 includes a box part 27 which surrounds the electric power source 4, with a duct part 28 feeding the air to the box part 27. An exhaust part or exhaust outlet 29 is formed in the box part 27, to direct the air outside of the housing 2. Thus, air passing through the cooling fan is exhausted through the parts 27, 28 and 29. The partition 25, duct part 28, and box part 27, as well as the exhaust part 29 of the air guide member 26 can be formed integrally or by separate parts which are connected to each other, for example by an adhesive material, or other suitable connections. Thus, in this arrangement for an external memory apparatus 1, the electric power supply device can be cooled by air which has previously cooled the disk drive device 3.

Obviously, numerous modifications and variations of the present invention are possible in light of the above teachings. It is therefore to be understood that within the scope of the appended claims, the invention may be practiced otherwise than as specifically described herein.

What as claimed as new and desired to be secured by letters patent of the United States is:

1. An external memory apparatus having at least one of an information recording and an information playback device therein comprising:

a housing;

a cooling fan installed inside and spaced from the housing of the external memory apparatus;

an exhaust outlet, through which air flow from the cooling fan is exhausted, said exhaust outlet disposed on the housing;

wherein a duct member which leads air from said cooling fan to the exhaust outlet is disposed inside the housing between the exhaust outlet and the cooling fan, and said duct member is formed of a sheet material comprising a soft-type film;

wherein a cross-sectional area of the exhaust outlet through which air flows is smaller than a cross-sectional area of said cooling fan, and said duct member is formed to be gradually narrowing in a direction extending from said cooling fan to said exhaust outlet, thereby minimizing the area of the cross-section of said exhaust outlet.

2. The external memory apparatus of claim 1, wherein the duct member is formed by folding a sheet material having a predetermined form.

3. The external memory apparatus of claim 1, wherein said cooling fan is fixed to a support member by a fastener, and the duct member is fixed to the support member together with the cooling fan by the same fastener, and wherein the support member is supported by the housing.

4. The external memory apparatus of claim 1, further comprising one of a foam material and a soft-type material inserted between either said cooling fan and said duct member or the exhaust outlet of the housing and said duct member.

5. The external memory apparatus of claim 1, further comprising eaves disposed on said cooling fan.

6. The external memory apparatus of claim 1, further comprising a partition member which diverts a portion of the air passing through said cooling fan to a second exhaust outlet, and further wherein an air guide device is provided in the form of a box part which surrounds a heat generating device, and a second duct member is connected to said partition member and said box part for guiding air to the box part, and said second exhaust outlet is connected to said box part, whereby both of said exhaust outlets are disposed on a downstream side of said fan such that part of the air passing through said fan exits said housing through each of said exhaust outlets.

7. An external memory apparatus having at least one of an information recording and an information playback device therein comprising:

a housing;

a cooling fan installed inside and spaced from the housing of the external memory apparatus;

an exhaust outlet, through which air flow from the cooling fan is exhausted, said exhaust outlet disposed on the housing;

wherein a duct member which leads air from said cooling fan to the exhaust outlet is disposed inside the housing between the exhaust outlet and the cooling fan; and wherein a cross-sectional area of the exhaust outlet through which air flows is smaller than a cross-sectional area of said cooling fan, and said duct member is formed to be gradually narrowing in a direction extending from said cooling fan to said exhaust outlet, thereby minimizing the area of the cross-section of said exhaust outlet;

wherein the duct member is formed by folding a sheet material having a predetermined form and said sheet material having a predetermined form for the duct member includes an overlapping width portion for connecting the sheet material upon itself to form the duct member, and wherein the sheet material is connected to itself by a heat-melting method.

8. An external memory apparatus having at least one of an information recording and an information playback device therein comprising:

a housing;

a cooling fan installed inside and spaced from the housing of the external memory apparatus;

an exhaust outlet, through which air flow from the cooling fan is exhausted, said exhaust outlet disposed on the housing;

wherein a duct member which leads air from said cooling fan to the exhaust outlet is disposed inside the housing between the exhaust outlet and the cooling fan; and wherein a cross-sectional area of the exhaust outlet through which air flows is smaller than a cross-sectional area of said cooling fan, and said duct member is formed to be gradually narrowing in a direction extending from said cooling fan to said exhaust outlet, thereby minimizing the area of the cross-section of said exhaust outlet;

wherein the duct member is formed by folding a sheet material having a predetermined form and the sheet material having a predetermined form for forming the duct member has an overlapping width for connecting the sheet material upon itself to form the duct member, and wherein the sheet material is connected to itself by a staple.

9. An external memory apparatus having at least one of an information recording and an information playback device therein comprising:

a housing;

a cooling fan installed inside and spaced from the housing of the external memory apparatus;

an exhaust outlet, through which air flow from the cooling fan is exhausted, said exhaust outlet disposed on the housing;

wherein a duct member which leads air from said cooling fan to the exhaust outlet is disposed inside the housing between the exhaust outlet and the cooling fan; and wherein a cross-sectional area of the exhaust outlet through which air flows is smaller than a cross-sectional area of said cooling fan, and said duct member is formed to be gradually narrowing in a direction extending from said cooling fan to said exhaust outlet, thereby minimizing the area of the cross-section of said exhaust outlet;

the apparatus further including eaves disposed on said cooling fan and wherein at least one cable extends over said eaves.

10. The external memory apparatus of claim 9, wherein said eaves cover a metal frame of said fan.

11. The external memory device of claim 10, wherein a plurality of cables extend over said eaves and between said eaves and said housing of said external memory device, and further wherein said eaves are formed of a soft material.

12. An external memory apparatus having at least one of an information recording and an information playback device therein comprising:

a housing;

a cooling fan installed inside of said housing and spaced from a first side of said housing;

an exhaust outlet disposed on said first side of said housing through which air from said cooling fan is exhausted;

a duct member extending from said cooling fan to said outlet such that air exiting said fan travels through said duct and then through said exhaust outlet, said duct having a first cross-sectional area adjacent said exhaust outlet which is less than a second cross-sectional area adjacent said cooling fan; and at least one connector element mounted upon said first side of said housing and extending through said first side of said housing;

wherein said first side of said housing is a vertical side of said housing, and wherein a downstream end of said duct member is flanged with flanges extending parallel to said first side of said housing, and wherein an elastic material is disposed between said flanges and said first side; and wherein said fan includes a frame and eaves are provided over at least part of said frame, and wherein said housing includes a top side member, and further wherein at least one cable is disposed between said eaves and said top side member of said housing.

13. The external memory apparatus of claim 12, wherein said at least one connector element protrudes into said housing from said first side by a first length, and wherein said duct member includes a first portion in which said duct has a substantially constant cross-sectional area along a length of said first portion, and wherein said length of said first portion is greater than said first length, said duct member further including a second portion disposed between said first portion and said fan, said second portion including a cross-sectional area which decreases along said second portion with respect to a direction extending from said fan toward said first portion such that a cross-sectional area of said second portion at a first location adjacent said first portion is smaller than a cross-sectional area of said second portion at a second location which is closer to said fan than said first location.

14. The external memory of claim 12, wherein a plurality of said connector elements are provided mounted upon said first side of said housing and extend through said first side of said housing.

15. The apparatus of claim 12, wherein said duct member includes a tapered portion in which a cross-sectional area of said duct member decreases in a direction extending from said fan toward said first side of said housing such that a cross-sectional area of said duct is smaller in said tapered portion for locations closer to said first side of said housing.

16. The external memory apparatus of claim 12, wherein said frame includes a surface having an aperture therein through which air passes to allow air to flow through said frame and through said fan, and wherein said duct member extends from said frame to said first side of said housing.

17. The external memory apparatus of claim 16, wherein said surface of said frame is parallel to said first side, and wherein said duct extends in a direction orthogonal to said first side and said surface.

18. The external member apparatus of claim 17, wherein said frame of said fan includes a flange connected to a bottom surface of said housing, and wherein at least one cable extends between said frame and a top side of said housing.

* * * * *